(12) United States Patent
Komatsuda

(10) Patent No.: US 7,800,734 B2
(45) Date of Patent: Sep. 21, 2010

(54) LIGHTING APPARATUS, EXPOSURE APPARATUS AND MICRODEVICE MANUFACTURING METHOD

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 563 days.

(21) Appl. No.: 11/660,927

(22) PCT Filed: Sep. 21, 2005

(86) PCT No.: PCT/JP2005/017346

§ 371 (c)(1),
(2), (4) Date: Feb. 23, 2007

(87) PCT Pub. No.: WO2006/033336

PCT Pub. Date: Mar. 30, 2006

(65) Prior Publication Data

US 2009/0002662 A1    Jan. 1, 2009

(30) Foreign Application Priority Data

Sep. 22, 2004  (JP)  ............................... 2004-275048

(51) Int. Cl.
*G03B 27/54* (2006.01)
*G03B 27/68* (2006.01)
*G03B 27/42* (2006.01)
*G03B 27/52* (2006.01)

(52) U.S. Cl. ............................... 355/67; 355/52; 355/53; 355/55

(58) Field of Classification Search ............. 355/67–71, 355/53, 44, 45, 52, 55; 359/599, 615, 584
See application file for complete search history.

(56) References Cited

U.S. PATENT DOCUMENTS 5,311,565 A * 5/1994 Horikawa ..................... 378/43

(Continued)

FOREIGN PATENT DOCUMENTS

JP          01092700 A  *  4/1989

(Continued)

OTHER PUBLICATIONS

European Search Report dated Nov. 14, 2008, from the European Patent Office in corresponding Application No. 05785921.7.

(Continued)

*Primary Examiner*—Peter B Kim
*Assistant Examiner*—Christina Riddle
(74) *Attorney, Agent, or Firm*—Finnegan, Henderson, Farabow, Garrett & Dunner, L.L.P.

(57) ABSTRACT

An illumination apparatus for illuminating a surface (M) to be irradiated with illumination light emitted from a light source (2) comprises a reflection type fly-eye optical systems (12, 14) disposed between the light source (2) and the surface (M) to be irradiated and constituted by a plurality of reflection partial optical systems for wavefront-dividing a light beam from the light source (2) and superposing divided portions of the light beam onto each other on the surface (M) to be irradiated and a reflection type optical system (10) disposed between the light source (2) and the reflection type fly-eye optical systems (12, 14) for guiding the illumination light to the reflection type fly-eye optical systems (12, 14). The reflection type optical system (10) has a reflecting surface at least partly constructed by a diffusing surface.

16 Claims, 7 Drawing Sheets

U.S. PATENT DOCUMENTS

| | | | |
|---|---|---|---|
| 5,439,781 A | 8/1995 | MacDowell et al. | |
| 5,581,605 A * | 12/1996 | Murakami et al. | 378/84 |
| 5,669,708 A * | 9/1997 | Mashima et al. | 362/341 |
| 5,896,438 A | 4/1999 | Miyake et al. | |
| 6,118,559 A * | 9/2000 | Kathman et al. | 359/9 |
| 6,441,963 B2 * | 8/2002 | Murakami et al. | 359/584 |
| 6,452,661 B1 | 9/2002 | Komatsuda | |
| 6,498,351 B1 | 12/2002 | Kruizinga et al. | |
| 6,583,932 B1 * | 6/2003 | George et al. | 359/566 |
| 6,833,904 B1 | 12/2004 | Komatsuda | |
| 6,927,887 B2 | 8/2005 | Naulleau | |
| 7,002,747 B2 | 2/2006 | Augustyn et al. | |
| 2002/0001109 A1 * | 1/2002 | Hamano et al. | 359/9 |
| 2002/0003855 A1 | 1/2002 | Miyake et al. | |
| 2002/0041368 A1 * | 4/2002 | Ota et al. | 355/55 |
| 2002/0110217 A1 | 8/2002 | Miyake et al. | |
| 2002/0160545 A1 * | 10/2002 | Anderson et al. | 438/22 |
| 2002/0186811 A1 * | 12/2002 | Weiss et al. | 378/34 |
| 2003/0072046 A1 * | 4/2003 | Naulleau | 359/15 |
| 2003/0081722 A1 * | 5/2003 | Kandaka et al. | 378/70 |
| 2003/0227657 A1 * | 12/2003 | Naulleau | 359/15 |
| 2004/0136041 A1 * | 7/2004 | Togino | 359/225.1 |
| 2006/0001971 A1 * | 1/2006 | Schadt et al. | 359/537 |

FOREIGN PATENT DOCUMENTS

| | | |
|---|---|---|
| JP | 06-333798 | 12/1994 |
| JP | 09-298140 | 11/1997 |
| JP | 10-070058 | 3/1998 |
| JP | 11-312638 | 11/1999 |
| JP | 2000-269130 | 9/2000 |
| JP | 2005-294622 | 10/2005 |

OTHER PUBLICATIONS

European Search Report dated Mar. 5, 2009, from the European Patent Office in corresponding Application No. 05785921.7.

* cited by examiner

LIGHTING APPARATUS, EXPOSURE APPARATUS AND MICRODEVICE MANUFACTURING METHOD

TECHNICAL FIELD

The present invention relates to an illumination apparatus for manufacturing a microdevice such as a semiconductor device, liquid crystal display device, or thin-film magnetic head by a lithography process, an exposure apparatus equipped with the illumination apparatus, and a method of manufacturing a microdevice using the exposure apparatus.

BACKGROUND ART

In recent years, projection exposure apparatus for projecting and exposing a pattern of a mask onto a photosensitive substrate by using extreme ultraviolet light (EUV) in the wavelength region of about 5 to 40 nm as exposure light have been put into practical use. Reflection type optical systems are used (see, for example, Japanese Patent Application Laid-Open No. HEI 11-312638) in exposure apparatus for EUVL (extreme ultraviolet lithography), since glass materials exhibiting a high transmittance for short-wavelength light are limited.

In the projection exposure apparatus described in Japanese Patent Application Laid-Open No. HEI 11-312638, as shown in FIG. 6, laser light emitted from a non-EUV laser light source 201 and condensed by a condensing mirror 202 is caused to impinge at a point 204 onto a target material supplied by a nozzle 203, so that the target material is turned into plasma in response to intense energy, whereby EUV light is generated. Thus generated EUV light is condensed by a condensing mirror 205 and is reflected by a guiding optical system 206, so as to be made incident on an entrance-side fly-eye mirror 207 in which a number of concave mirrors are arranged in parallel. The light beam reflected by the entrance-side fly-eye mirror 207 passes through an aperture stop 208, so as to be reflected by an exit-side fly-eye mirror 209 in which a number of concave mirrors are arranged in parallel, and then passes through the aperture stop 208 again, so as to be made incident on an optical system 210. The light beam reflected by the optical system 210 is condensed by an optical system 211, so as to illuminate a mask 212. A pattern image of the illuminated mask 212 is projected and exposed to a wafer (photosensitive substrate) 214 through a projection optical system 213.

DISCLOSURE OF THE INVENTION

The illumination apparatus constituting the projection exposure apparatus described in Japanese Patent Application Laid-Open No. HEI 11-312638 subjects the illumination light incident on the entrance-side fly-eye mirror 207 to wavefront division, and superposes the divided portions onto each other on the mask, so as to make the illumination light attain a uniform illuminance. For securing a high uniformity in illuminance, however, it is necessary that illuminance distribution changes caused by high-frequency waves be minimized in the illuminance distribution of the illumination light incident on the entrance-side fly-eye mirror 207. Namely, the light beam having a light intensity distribution shown in FIG. 3B which is free of illuminance distribution changes caused by high-frequency waves is more desirably incident on the entrance-side fly-eye mirror 207 than the light beam having a light intensity distribution shown in FIG. 3A including many illuminance distribution changes caused by high-frequency waves.

Therefore, in order to realize an illumination apparatus which can secure a high uniformity in illuminance of illumination light, it is necessary that light intensity distributions caused by high-frequency components be eliminated from the light intensity distribution of the light beam incident on the entrance-side fly-eye mirror 207 while suppressing the loss in quantity of the illumination light.

It is an object of the present invention to provide an illumination apparatus which can improve the uniformity in illuminance of illumination light while suppressing the loss in quantity of illumination light, an exposure apparatus equipped with the illumination apparatus, and a method of manufacturing a microdevice using the exposure apparatus.

The illumination apparatus of the present invention is an illumination apparatus for illuminating a surface to be irradiated with illumination light emitted from a light source, the illumination apparatus comprising a reflection type fly-eye optical system disposed between the light source and the surface to be irradiated and constituted by a plurality of reflection partial optical systems for wavefront-dividing a light beam from the light source and superposing divided portions of the light beam onto each other on the surface to be irradiated; and a reflection type optical system, disposed between the light source and the reflection type fly-eye optical system, for guiding the illumination light to the reflection type fly-eye optical system; wherein the reflection type optical system has a reflecting surface at least partly constructed by a diffusing surface.

Since the reflecting surface of the reflection type optical system disposed on the upstream of the reflection type fly-eye optical system is at least partly constructed by a diffusing surface, the illumination apparatus of the present invention can eliminate light intensity distributions caused by high-frequency components from the light intensity distribution of the illumination light incident on the reflection type fly-eye optical system, thereby improving the uniformity in illuminance distribution of illumination light. Therefore, when this illumination apparatus is used in an exposure apparatus, the illumination light can uniformly illuminate a mask surface (and a photosensitive substrate surface as well), so that the resolving power, contrast, and the like can be prevented from decreasing on the photosensitive substrate, whereby fine patterns formed on a mask can favorably be exposed onto the photosensitive substrate. The reflection type optical system disposed on the upstream of the reflection type fly-eye optical system may be a single mirror or constructed by a plurality of mirrors. When using a plurality of mirrors, the diffusing surface may be formed in one or a plurality of mirrors.

The illumination apparatus of the present invention may be characterized in that a diffusion angle of the diffusing surface is such an angle that a full width at half maximum of a range in which a light beam diffused from a point of the diffusing surface by the diffusing surface reaches an entrance surface of the reflection type fly-eye optical system is D/2 to D/100, where D is the entrance diameter of the fly-eye optical system.

When the light beam diffused by the diffusing surface spread wider than D/2 on the fly-eye surface, a loss in the light quantity occurs, which is unfavorable. When the diffused light beam is smaller than D/100, on the other hand, the effect by diffusion is smaller, which is unfavorable. Therefore, it will be preferred if the angle of the light beam diffused by the diffusing surface is such that the spread of the light beam in the fly-eye surface falls within the range of D/2 to D/100.

The illumination apparatus of the present invention may be characterized in that an RMS value indicating a surface roughness of the diffusing surface corresponding to a high-frequency region of a PSD (Power Spectral Density) value of a profile of the diffusing surface is smaller than 1/14 of a wavelength of the illumination light.

When the PSD value of the diffusing surface greatly differs from a PSD value of an ideal surface in a region corresponding to a high-frequency region, there is a possibility of light quantity loss and the like occurring, thereby causing a problem. Since the RMS value indicating the surface roughness of the diffusing surface corresponding to the high-frequency region is smaller than 1/14 of the wavelength of illumination light, problems such as light quantity loss can be reduced.

The illumination apparatus of the present invention may be characterized in that the difference between the PSD (Power Spectral Density) value of the profile of the diffusing surface and the PSD value of a fractal curve is smaller in a high-frequency region than in a frequency region lower than the high-frequency region.

It has empirically been known that the PSD value of an ideally polished surface profile is very close to the PSD value of a fractal curve represented by a function of $PSD=K/f^n$ (where f is the frequency, and K and n are constants). In other words, the profile of a measured surface can be considered closer to an ideal surface profile when the PSD curve of the measured surface profile approaches the PSD curve of the fractal curve. The PSD value of the diffusing surface in the high-frequency region in the present invention approaches the PSD value of the fractal curve. Namely, the PSD value of the diffusing surface in the high-frequency region is close to the PSD of the ideally polished surface, and is kept very low. FIG. 2 is a graph showing the PSD (broken line) of the ideally polished surface (hereinafter referred to as ideal surface) and the PSD (solid line) of the diffusing surface of the present invention. The present invention proposes roughening the diffusing surface in a frequency region lower than a high-frequency region as shown in FIG. 2. The PSD in a low-frequency region also approaches that of the ideally polished surface in the example of FIG. 2, but is not required to do so. For their difference, for example, an average difference in a high-frequency region and an average difference in other frequencies may be compared with each other, or their RMS values or maximum values may be compared with each other.

The illumination apparatus of the present invention may be characterized in that a boundary value between the high-frequency region and a frequency region lower than the high-frequency region is smaller than $D/2\lambda L$, where D is the diameter of the entrance surface of the reflection type fly-eye optical system, L is a distance from the reflection type optical system to the entrance surface of the reflection type fly-eye optical system, and $\lambda$ is a wavelength of the illumination light.

The diffusion angle of light becomes greater as the frequency of pitches in surface roughness of the diffusing surface is higher. Therefore, when the pitch of surface roughness in the diffusing surface is smaller, the diffusion angle of illumination light becomes very large, so that the illumination light diffuses into a direction failing to enter the reflection type fly-eye optical system, thereby lowering the quantity of illumination light.

Here, the reason why the boundary value between the high-frequency region and an intermediate frequency region with a frequency lower than that of the high-frequency region is made smaller than $D/2\lambda L$ is determined by the following study. Let D/2 (m) be the value by which light diffuses out of the range in which the light can be made incident on the reflection type fly-eye optical system. Supposing that P (m) is the pitch (period) of undulations of the diffusing surface, and $\lambda$ (m) is the wavelength of the illumination light, the diffusion angle becomes $\lambda/P$ (rad). When light proceeds by L (m) at the diffusion angle of $\lambda/P$ (rad), the spread by the diffusion becomes $L\lambda/P$ (m). Therefore, when $L\lambda/P$ (m)=D/2, $P=2\lambda L/D$, whereby its corresponding frequency becomes $D/2\lambda L$.

When the pitch P is smaller than $2\lambda L/D$ here, the diffusion angle becomes too large, thereby yielding a light quantity loss. In the present invention, the surface profile corresponding to the high-frequency region where the diffusion angle may become so large as to yield a light quantity loss is closer to an ideal surface profile, whereby high-frequency components of illumination intensity can be eliminated while lowering the light quantity loss.

The illumination apparatus of the present invention may also be characterized in that the boundary value between the high-frequency region and a frequency region lower than the high-frequency region is greater than $D/100\lambda L$, where D is the diameter of the entrance surface of the reflection type fly-eye optical system, L is a distance from the reflection type optical system to the entrance surface of the reflection type fly-eye optical system, and $\lambda$ is a wavelength of the illumination light.

Here, the reason why the boundary value between the high-frequency region and an intermediate frequency region with a frequency lower than that of the high-frequency region is made greater than $D/100\lambda L$ is as follows. Supposing that D/100 (m) is the value by which light diffuses out of the range in which the light can be made incident on the reflection type fly-eye optical system, $P=100\lambda L/D$ as mentioned above, whereby its corresponding frequency becomes $D/100\lambda L$.

When the pitch P is greater than $100\lambda L/D$ here, the effect by diffusion becomes too small, thereby lowering the original function of eliminating high-frequency components of optical illumination intensity distributions. Therefore, by making the boundary value greater than $D/100\lambda L$, the present invention enhances the function of diffusing the light beam, so as to have the function of eliminating high-frequency components of illumination intensity distributions, thereby more effectively eliminating the high-frequency components of optical illumination intensity distributions.

Since the PSD (Power Spectral Density) of the diffusing surface in the high-frequency region differs less from the profile represented by a fractal curve, the above-mentioned illumination apparatus can diffuse the light beam within the range where the light can be made incident on the reflection type fly-eye optical system. Therefore, light intensity distributions caused by high-frequency components can be eliminated from the light intensity distribution of the illumination light incident on the reflection type fly-eye optical system, while suppressing the loss in quantity of the illumination light incident on the reflection type fly-eye optical system, whereby the uniformity in illuminance distribution of the illumination light can be improved.

The illumination apparatus of the present invention may be characterized in that a surface roughness of the diffusing surface in a pitch finer than 1 mm is 0.5 to 3 nm RMS.

Since the roughness of the diffusing surface in a pitch finer than 1 mm is 0.5 to 3 nm RMS, the illumination apparatus of the present invention can keep a high reflectance of the illumination light with respect to the diffusing surface, and thus can prevent the quantity of illumination light from being lost. Therefore, light intensity distributions caused by high-frequency components can be eliminated from the light intensity distribution of the illumination light incident on the reflection type fly-eye optical system, while suppressing the loss in quantity of the illumination light incident on the reflection type fly-eye optical system, whereby the uniformity in illuminance distribution of the illumination light can be improved. For diffusing light, it is necessary for the surface to undulate at least several times within the light beam's diameter of the light. Since the finest light beam's diameter of light in a typical exposure apparatus is about 20 to 30 mm, a sufficient number of undulations of the surface can be formed within the light beam's diameter of the light when the pitch is 1 mm or less.

The illumination apparatus of the present invention may be characterized in that the light beam illuminating the surface to be irradiated is EUV light having a wavelength of 5 to 40 nm.

The case using EUV light of 5 to 40 nm as the illumination light can also favorably improve the uniformity in illumination.

The exposure apparatus of the present invention is an exposure apparatus for transferring a pattern of a mask onto a photosensitive substrate, the exposure apparatus comprising the illumination apparatus of the present invention for illuminating the mask.

The exposure apparatus of the present invention is equipped with the illumination apparatus capable of improving the uniformity in illuminance of illumination light while suppressing the loss in quantity of the illumination light, and thus can prevent the resolving power, contrast, and the like from decreasing on the photosensitive substrate, whereby fine patterns formed on a mask can be exposed onto the photosensitive substrate with a high throughput.

The method of manufacturing a microdevice in accordance with the present invention comprises an exposure step of exposing a pattern of a mask onto a photosensitive substrate by using the exposure apparatus of the present invention and a developing step of developing the photosensitive substrate exposed by the exposing step.

The method of manufacturing a microdevice in accordance with the present invention performs exposure by using the exposure apparatus capable of improving the uniformity in illuminance of illumination light while suppressing the loss in quantity of the illumination light, and thus can prevent the resolving power, contrast, and the like from decreasing on the photosensitive substrate, whereby microdevices having fine circuit patterns can be manufactured with a high throughput.

Since the reflecting surface of the reflection type optical system is at least partly constructed by a diffusing surface, the illumination apparatus of the present invention can eliminate light intensity distributions caused by high-frequency components from the light intensity distribution of the illumination light incident on the reflection type fly-eye optical system, while suppressing the loss in quantity of the illumination light incident on the reflection type fly-eye optical system, and thus can improve the uniformity in illuminance distribution of the illumination light. Therefore, when this illumination apparatus is employed in an exposure apparatus, the illumination light can uniformly illuminate a mask surface (and a photosensitive substrate surface as well), so that the resolving power, contrast, and the like can be prevented from decreasing on the photosensitive substrate, whereby fine patterns formed on a mask can be exposed onto the photosensitive substrate with a high throughput.

The exposure apparatus of the present invention is equipped with the illumination apparatus capable of improving the uniformity in illuminance of illumination light while suppressing the loss in quantity of the illumination light, and thus can prevent the resolving power, contrast, and the like from decreasing on the photosensitive substrate, whereby fine patterns formed on a mask can be exposed onto the photosensitive substrate with a high throughput.

The method of manufacturing a microdevice in accordance with the present invention performs exposure by using the exposure apparatus capable of improving the uniformity in illuminance of illumination light while suppressing the loss in quantity of the illumination light, and thus can prevent the resolving power, contrast, and the like from decreasing on the photosensitive substrate, whereby microdevices having fine circuit patterns can be manufactured with a high throughput.

BEST MODES FOR CARRYING OUT THE INVENTION

Figure 1:
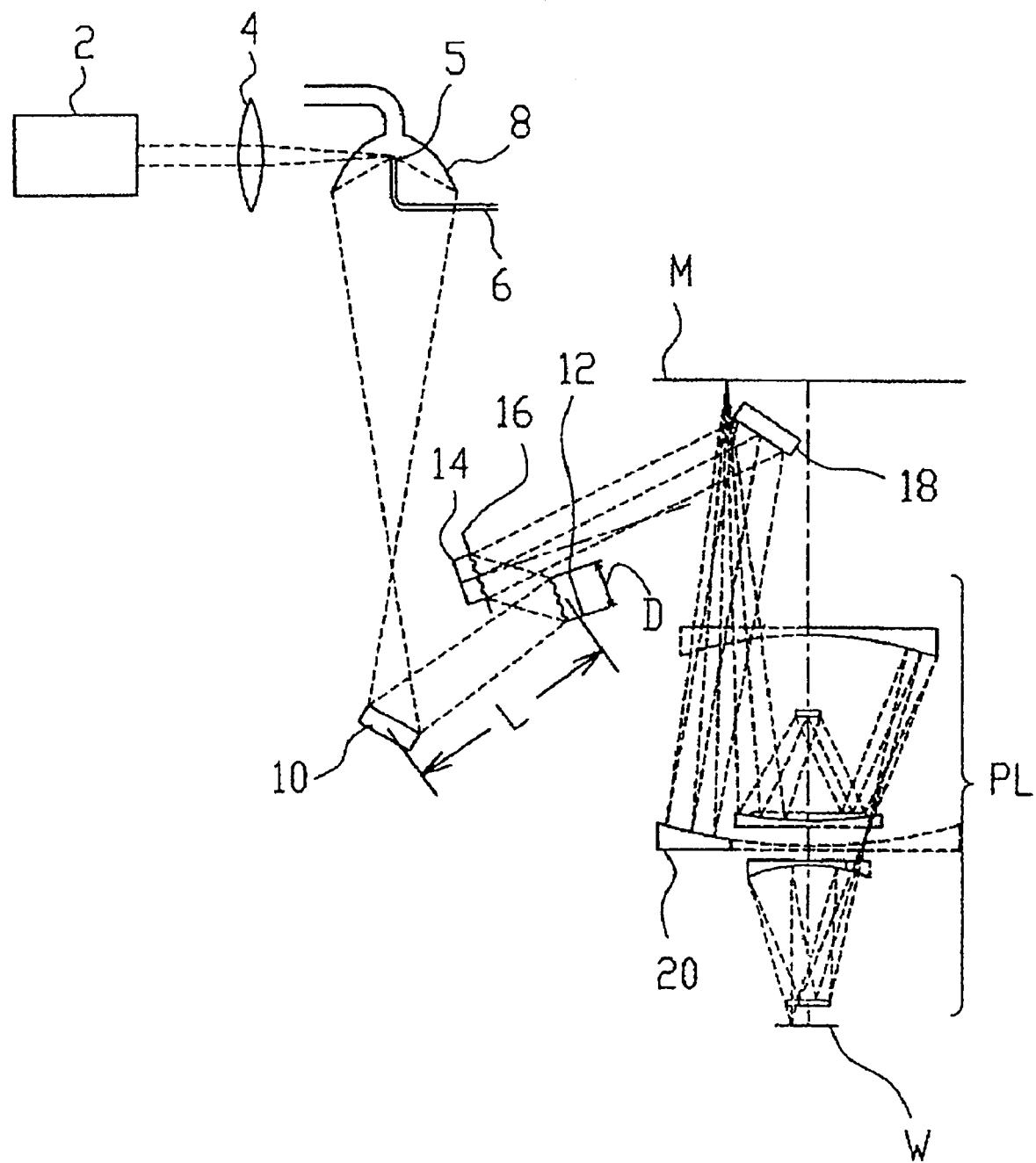
[FIG. 1] A view showing a schematic structure of a projection exposure apparatus in accordance with an embodiment.

In the following, the projection exposure apparatus in accordance with an embodiment of the present invention will be explained with reference to the drawings. FIG. 1 is a view showing a schematic structure of the projection exposure apparatus in accordance with this embodiment.

This projection exposure apparatus is an exposure apparatus of a step-and-scan type which uses exposure light (illumination light), i.e., EUV (extreme ultraviolet) light having a wavelength of about 5 to 40 nm, emitted from an illumination apparatus constructed by a high-output laser light source 2, a condensing lens 4, a plasma light source 5, a nozzle 6, a condensing mirror 8, a collector mirror 10, reflection type fly-eye optical systems 12, 14, condenser mirrors 18, 20, and the like, and transfers an image of a pattern on a mask (surface to be irradiated) M to a wafer W as a photosensitive substrate coated with a photosensitive material (resist), while moving the mask M and wafer W relative to a projection optical system PL.

Since the transmittance of EUV light as the exposure light with respect to air is low, the optical path through which the EUV light passes is covered with a vacuum chamber which is not depicted in this projection exposure apparatus. Laser light emitted from the high-output laser light source 2 such as YAG or excimer laser light source pumped with a semiconductor laser is condensed by the condensing lens 4 into a single point (light-condensing point) which acts as the plasma light source 5. At the light-condensing point, xenon gas (Xe), krypton gas (Kr), or the like as a target for the plasma light source is jetted from the nozzle 6. This target is pumped to a plasma state by the energy of the laser light emitted from the high-output laser light source 2. When this state shifts to a lower potential state, EUV light, ultraviolet light having a wavelength of 100 nm or longer, visible light, and light having other wavelengths are emitted.

The EUV light and the like emitted from the plasma light source 5 are made incident on the condensing mirror 8. The condensing mirror 8 is arranged such that the first focal position of the condensing mirror 8 or its vicinity and the light-condensing point acting as the plasma light source 5 coincide with each other. The inner face of the condensing mirror 8 is formed with an EUV light reflecting film, e.g., a multilayer film in which molybdenum (Mo) and silicon (Si) alternate with each other. Therefore, only EUV light having a wavelength of about 13 nm in the EUV light and the like incident on the condensing mirror 8 is reflected by the condensing mirror 8, so as to be condensed at the second focal position of the condensing mirror 8. When performing exposure with EUV light having a wavelength of about 11 nm, it will be preferred if a reflecting film which reflects only the EUV light having the wavelength of about 11 nm, e.g., a multilayer film made of molybdenum (Mo) and beryllium (Be), is used.

The EUV light reflected by the condensing mirror 8 is condensed as exposure light (illumination light) at the second focal position of the condensing mirror 8 or its vicinity, and then is reflected by the collector mirror (reflection type collector optical system) 10. For improving the reflectance for EUV light, the collector mirror 10 is constructed by a substrate made of glass, ceramics, a metal, or the like and a multilayer film made of molybdenum (Mo) and silicon (Si) formed on the substrate. The reflecting surface of the collector mirror 10 is constructed by a diffusing surface like lemon peel, in which scattering of a roughly polished surface is lowered by chemical corrosion. Alternatively, the reflecting surface of the substrate of the collector mirror 10 may be subjected to etching, imprinting, or embossing, so as to form a reflecting surface having roughness like a lemon skin. Namely, it does not have a reflecting surface constructed by an assembly of convex mirrors having a regular small focal length, but a random reflecting surface with no periodicity in which convex and concave mirrors having different focal lengths are assembled.

The diffusing surface of the collector mirror 10 is constructed such that the difference between the PSD (Power Spectral Density) of the profile of the diffusing surface and the PSD of a fractal curve is smaller in a high-frequency region. Preferably, as mentioned above, the boundary value between the high-frequency region and a frequency region lower than the high-frequency region is smaller than $D/2\lambda L$ but greater than $D/100\lambda L$, where D is the diameter of the entrance surface of the entrance-side fly-eye mirror 12 (arranged at a position substantially optically conjugate with the surface to be irradiated) that will be explained later, L is the distance from the collector mirror 10 to the entrance surface of the entrance-side fly-eye mirror 12, and $\lambda$ is the wavelength of the EUV light.

Figure 2:
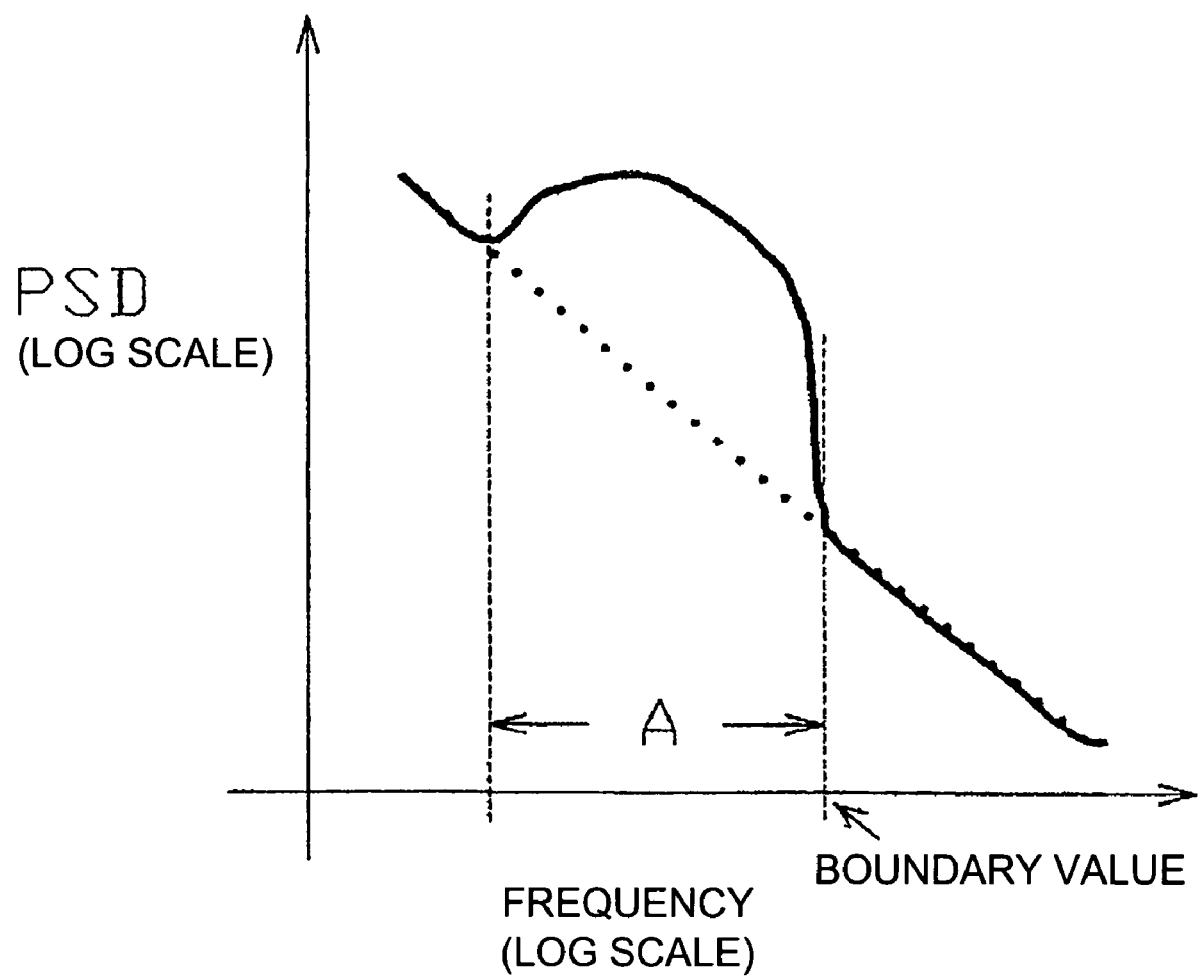
[FIG. 2] A graph showing the surface roughness of an ideally polished reflecting surface and the surface roughness of a diffusing surface of a collector mirror in accordance with the embodiment.

FIG. 2 is a graph showing the surface roughness (broken line) of an ideally polished reflecting surface (hereinafter referred to as ideal surface) and the surface roughness (solid line) of the collector mirror 10. The surface profile of the ideal surface indicated by the broken line is a fractal state, i.e., a state where macrostructurally similar profiles can be observed even when the reflecting surface is magnified. The PSD (power spectral density) in the fractal state can be expressed by $K/f^n$. Here, f is the frequency, and K and n are constants. The PSD in this fractal state becomes the broken line in the graph of FIG. 2 when plotted in a double logarithmic chart. The curve indicated by the broken line in the graph of FIG. 2 shows the surface roughness of the ideal surface.

The surface roughness of the diffusing surface of the collector mirror 10 indicated by the solid line is constructed such as to diffuse the illumination light (exposure light) within a range in which it can be made incident on the entrance-side fly-eye mirror 12. Namely, in a predetermined frequency region A (hereinafter referred to as intermediate frequency region) shown in FIG. 2, the diffused illumination light diffuses within the range in which it can be made incident on the entrance-side fly-eye mirror 12. That is, the surface roughness of the diffusing surface of the collector mirror 10 is roughened to such an extent that the illumination light diffuses within a range in which it can be made incident on the entrance-side fly-eye mirror 12. In a frequency region higher than the intermediate region, i.e., high-frequency region, the diffusion angle of illumination light (exposure light) with respect to the diffusing surface becomes greater, since it is in reverse proportion to the pitch of the surface roughness of the diffusing surface, so that the diffused illumination light diffuses out of the range in which it can be made incident on the entrance-side fly-eye mirror 12, which is why the difference from the profile represented by the curve indicated by the broken line is made smaller. This difference can suppress the loss in quantity of the light incident on the entrance-side fly-eye mirror 12, since the effect of diffusion in the high-frequency region can be made smaller when the surface roughness (RMS value) of the diffusing surface corresponding to the high frequency region is smaller than $1/14$ of the wavelength of the illumination light.

For enhancing the effect of diffusion with less light quantity loss, it will be preferred if the full width at half maximum of a range in which a light beam diffused from a point of the diffusing surface by the diffusing surface spreads and reaches the entrance surface of the entrance-side fly-eye mirror 12 in a widening fashion is D/2 to D/100, where D is the entrance diameter of the entrance-side fly-eye mirror 12.

Figure 3A:
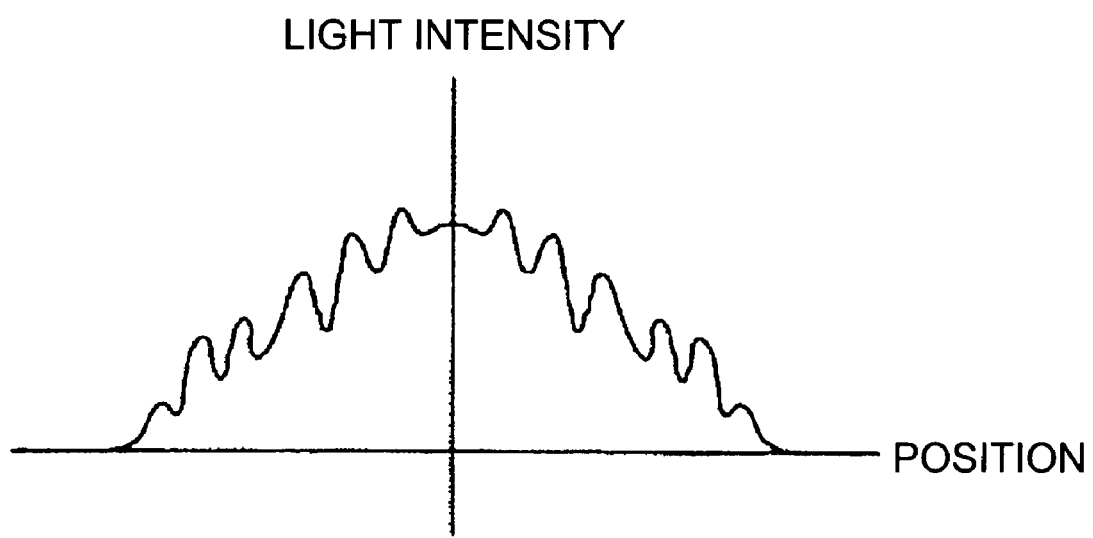
[FIG. 3A] A light intensity distribution of illumination light before being made incident on the collector mirror in accordance with the embodiment.
Figure 3B:
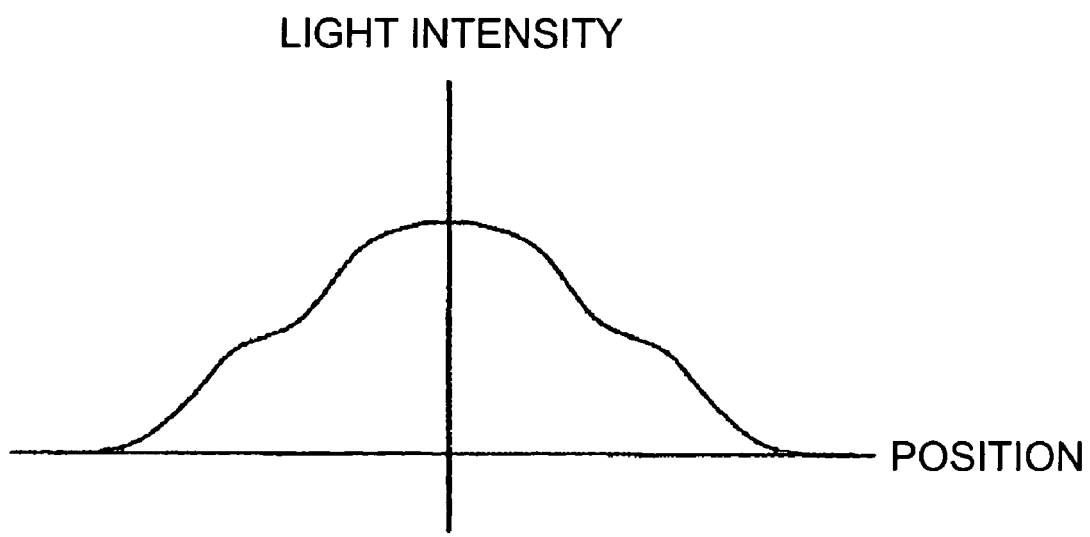
[FIG. 3B] A graph showing the light intensity distribution of illumination light after being reflected by the collector mirror in accordance with the embodiment.

Therefore, even when the EUV light before being made incident on the collector mirror 10 has the light intensity distribution shown in FIG. 3A, for example, the EUV light after being reflected by the reflecting surface (diffusing surface) of the collector mirror 10 attains the light intensity distribution shown in FIG. 3B. Namely, diffusing the EUV light incident on the collector mirror 10 can eliminate light intensity distributions caused by high-frequency components from the light quantity distribution of EUV light, and can improve the uniformity in illuminance distribution of EUV light while keeping the quantity of EUV light.

The surface roughness of the diffusing surface of the collector mirror 10 is such that the roughness of pitches finer than 1 mm is 0.5 to 3 nm RMS (Root-Mean-Square). Here, the RMS refers to root-mean-square, which is a standard deviation representing a deviation in the surface roughness of the collector mirror 10. This can prevent the reflectance of the EUV light with respect to the diffusing surface of the collector mirror 10 from decreasing, and can keep the quantity of the EUV light from decreasing. For diffusing light, it is necessary for the surface to undulate at least several times within the light beam's diameter of the light. Since the finest light beam's diameter of EUV light in the projection exposure apparatus in accordance with this embodiment is about 20 to 30 mm while the pitch is 1 mm or less, a sufficient number of undulations of the surface can be formed within the light beam's diameter of EUV light.

The EUV light having a high illuminance uniformity is reflected by the collector mirror 10, so as to be guided to the reflection type fly-eye optical systems 12, 14 acting as an optical integrator, and is made incident on the entrance-side fly-eye mirror 12 constituting the reflection type fly-eye optical systems 12, 14 on one side. The entrance-side fly-eye mirror 12 is constructed by elementary mirrors (reflection partial optical systems) which are a plurality of concave mirrors arranged in parallel, and is arranged at a position optically conjugate with the surface of the mask M or wafer W or its vicinity. For improving the reflectance of EUV light, the surface of each of the elementary mirrors constituting the entrance-side fly-eye mirror 12 is constructed by a substrate made of glass, ceramics, a metal, or the like and a multilayer film which is formed on the substrate and made of molybdenum (Mo) and silicon (Si).

The EUV light wavefront-divided by being made incident on the entrance-side fly-eye mirror 12 is reflected by the entrance-side fly-eye mirror 12 and passes through an aperture stop 16, so as to be made incident on the exit-side fly-eye mirror 14 constituting the reflection type fly-eye optical systems 12, 14 on the other side. The exit-side fly-eye mirror 14 is constructed by elementary mirrors (reflection partial optical systems) which are a plurality of concave mirrors arranged in parallel so as to correspond to the plurality of elementary mirrors constituting the entrance-side fly-eye mirror 12, respectively, and is arranged at a position optically conjugate with the pupil plane of the projection optical system PL that will be explained later. For improving the reflectance of EUV light, the surface of each of the elementary mirrors constituting the exit-side fly-eye mirror 14 is constructed by a substrate made of glass, ceramics, a metal, or the like and a multilayer film which is formed on the substrate and made of molybdenum (Mo) and silicon (Si).

A number of EUV light components wavefront-divided and reflected by the entrance-side fly-eye mirror 12 are made incident on the respective elementary mirrors constituting the exit-side fly-eye mirror 14, whereby a secondary light source constructed by a number of light source images is formed on the exit surface of the exit-side fly-eye mirror 14 or its vicinity. The EUV light from the secondary light source reflected by the exit-side fly-eye mirror 14 is made incident on the condenser mirror 18 through the aperture stop 16. The aperture stop 16 determines the numerical aperture of illumination light. For improving the reflectance of EUV light, the reflecting surface of the condenser mirror 18 is constructed by a substrate made of glass, ceramics, a metal, or the like and a multilayer film which is formed on the substrate and made of molybdenum (Mo) and silicon (Si).

The EUV light incident on the condenser mirror 18 is reflected by the condenser mirror 18, so as to be made incident on the condenser mirror 20, and is reflected by the condenser mirror 20, so as to be condensed on the mask M. In a superposing manner, the EUV light reflected by the condenser mirror 18 uniformly illuminates the reflection type mask M formed with a predetermined circuit pattern. The EUV light reflected by the reflection type mask M forms the secondary light source image at the pupil of the reflection type projection optical system PL, whereby an image of the pattern formed on the mask M is projected and exposed onto the wafer W as a photosensitive substrate coated with a resist.

Since the reflecting surface of the collector mirror is constructed by a diffusing surface, the projection exposure apparatus in accordance with this embodiment can eliminate light intensity distributions caused by high-frequency components from the light intensity distribution of the EUV light incident on the entrance-side fly-eye mirror. Since the PSD of the diffusing surface yields a smaller difference from a profile expressed by a fractal curve in the high-frequency region, the EUV light diffused by the collector mirror can be diffused within a range in which it can be made incident on the entrance-side fly-eye mirror. Since the EUV light diffused by the collector mirror is not diffused out of the range in which it can be made incident on the entrance-side fly-eye mirror, light intensity distributions caused by high-frequency components can be eliminated from the light intensity distribution of the EUV light incident on the entrance-side fly-eye mirror, while suppressing the loss in quantity of the EUV light incident on the entrance-side fly-eye mirror, whereby the uniformity in illuminance distribution of EUV light can be improved. Therefore, the EUV light can uniformly illuminate the mask surface (and the wafer surface as well), so that the resolving power, contrast, and the like can be prevented from decreasing on the wafer surface, whereby fine patterns formed on the mask can favorably be exposed onto the wafer surface with a high throughput.

Though the projection exposure apparatus in accordance with this embodiment uses EUV light as the exposure light, KrF excimer laser light, ArF excimer laser light, or $F_2$ laser light may also be used as the exposure light.

Though the whole reflecting surface of the collector mirror is constructed by a diffusing surface in the projection exposure apparatus in accordance with this embodiment, a part of the reflecting surface of the collector mirror may be constructed by a diffusing surface. A plurality of mirrors may be used instead of the single mirror. When forming a diffusing surface in a plurality of mirrors, the above-mentioned frequency band in which the surface profile is roughened can be determined for each mirror.

The exposure apparatus in accordance with the above-mentioned embodiment can manufacture a microdevice (semiconductor device, imaging device, liquid crystal display device, thin-film magnetic head, or the like) by illuminating a reticle (mask) with the illumination apparatus and exposing a transfer pattern formed on the mask to a photosensitive substrate (wafer) with the projection optical system. In the following, an example of techniques for yielding a semiconductor device as a microdevice by forming a predetermined circuit pattern on a wafer or the like as a photosensitive substrate while using the exposure apparatus in accordance with the above-mentioned embodiment will be explained with reference to the flowchart of FIG. 4.

Figure 4:
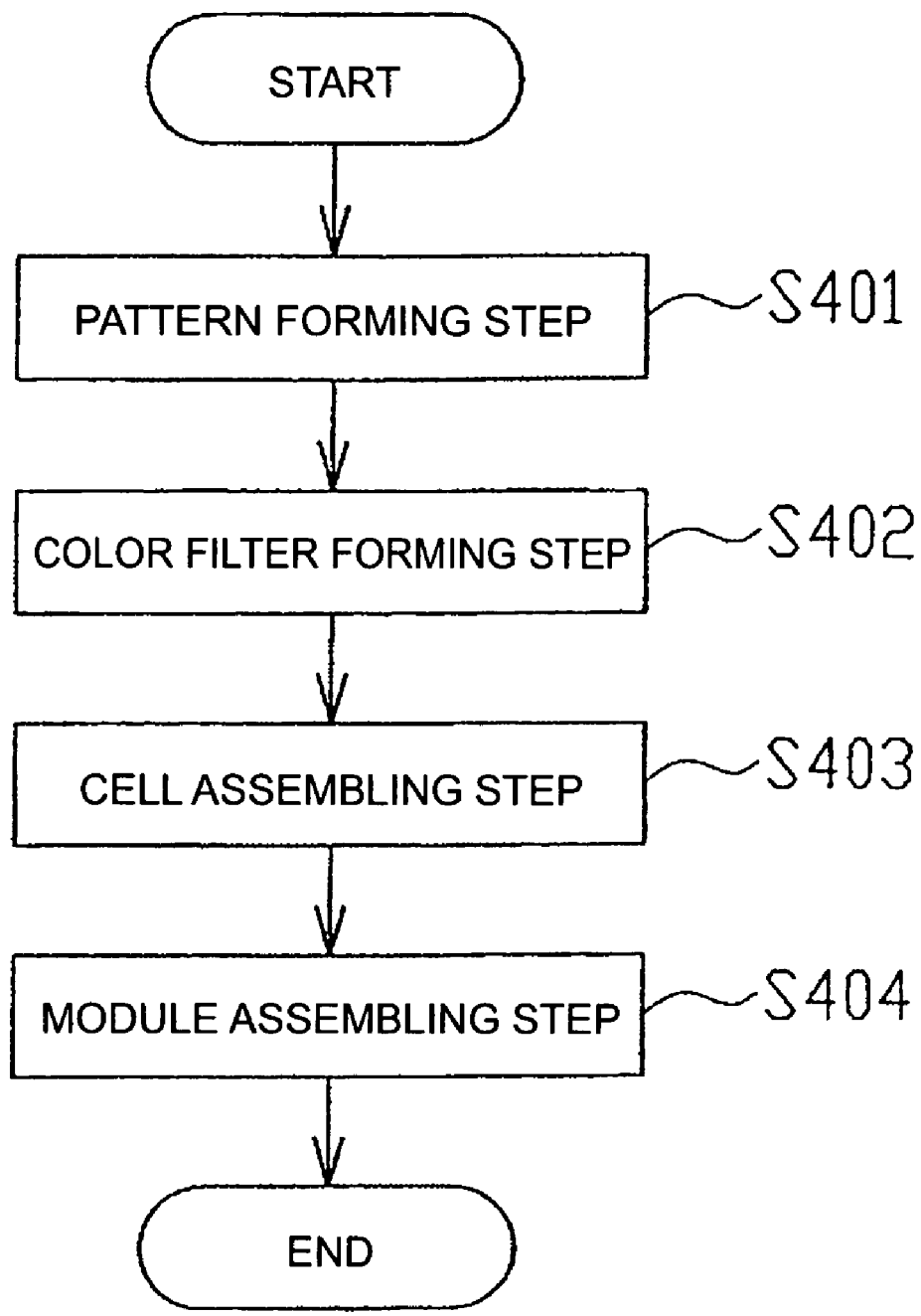
[FIG. 4] A flowchart showing a method of manufacturing a semiconductor device as a microdevice in accordance with an embodiment of the present invention.

First, at step S301 in FIG. 4, a metal film is vapor-deposited on one lot of wafer. In the next step S302, a photoresist is applied onto the metal film on the one lot of wafer. Subsequently, at step S303, the exposure apparatus in accordance with the above-mentioned embodiment is used, so that images of a pattern on a mask are successively exposed and transferred to respective shot areas on the one lot of wafer through the projection optical system. Thereafter, the photoresist on the one lot of wafer is developed at step S304, and then etching is performed on the one lot of wafer at step S305 while using the resist pattern as a mask, whereby circuit patterns corresponding to the pattern on the mask are formed in the respective shot areas on the wafer.

Thereafter, circuit patterns on upper layers are formed, and so forth, so as to manufacture a device such as semiconductor device. The above-mentioned microdevice manufacturing method performs exposure by using the exposure apparatus in accordance with the above-mentioned embodiment, and thus can prevent the resolving power, contrast, and the like from decreasing on the photosensitive substrate, whereby microdevices having fine patterns can be obtained with a high throughput. Though steps S301 to S305 perform the respective steps of vapor-depositing a metal film on a wafer, applying a resist on the metal film, and exposing, developing, and etching it, an oxide film of silicon may be formed on the wafer before these steps, then a resist may be applied onto the oxide film of silicon, and steps of exposing, developing, etching, and the like may be performed thereafter as a matter of course.

Figure 5:
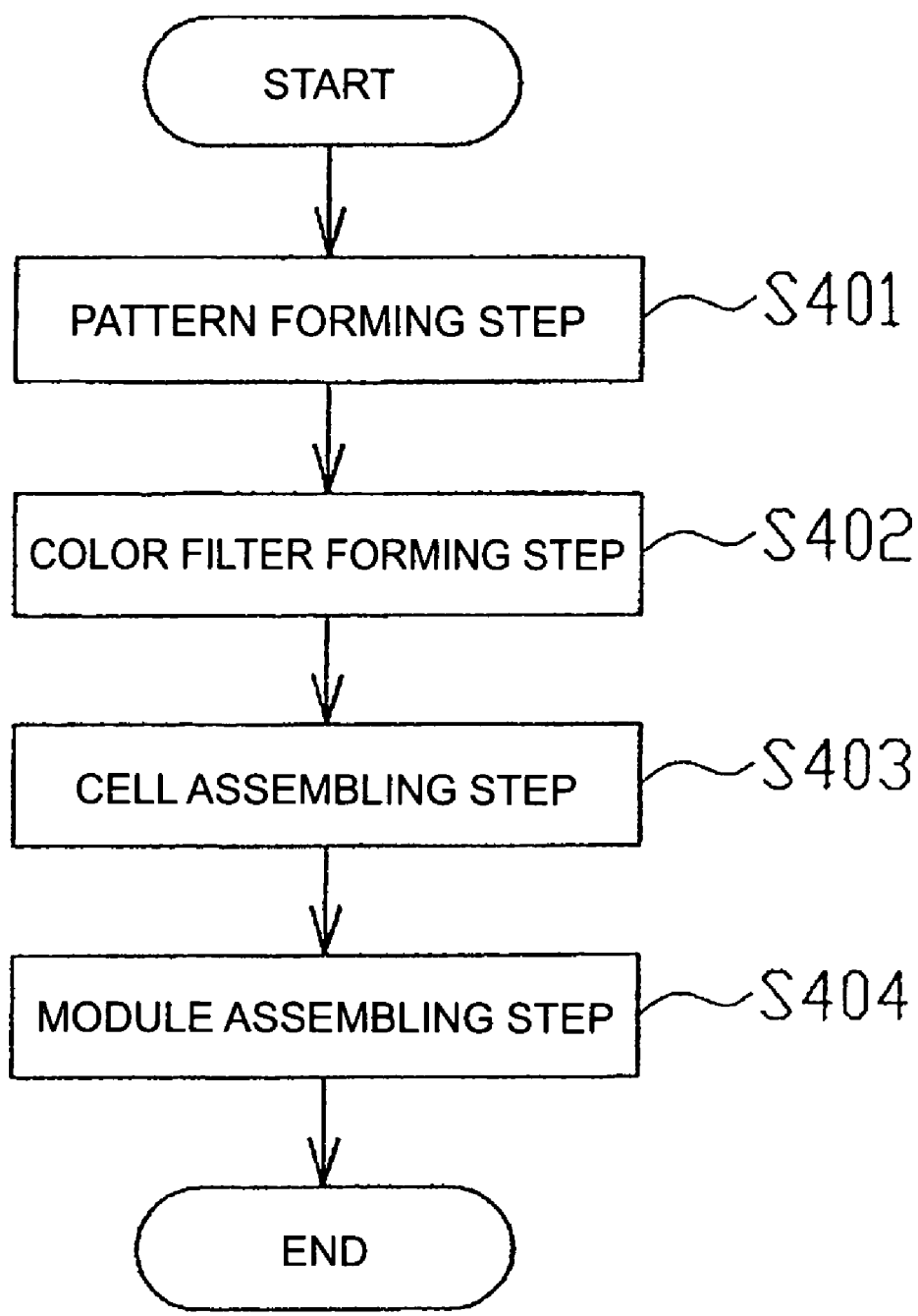
[FIG. 5] A flowchart showing a method of manufacturing a liquid crystal display device as a microdevice in accordance with an embodiment of the present invention.
Figure 6:
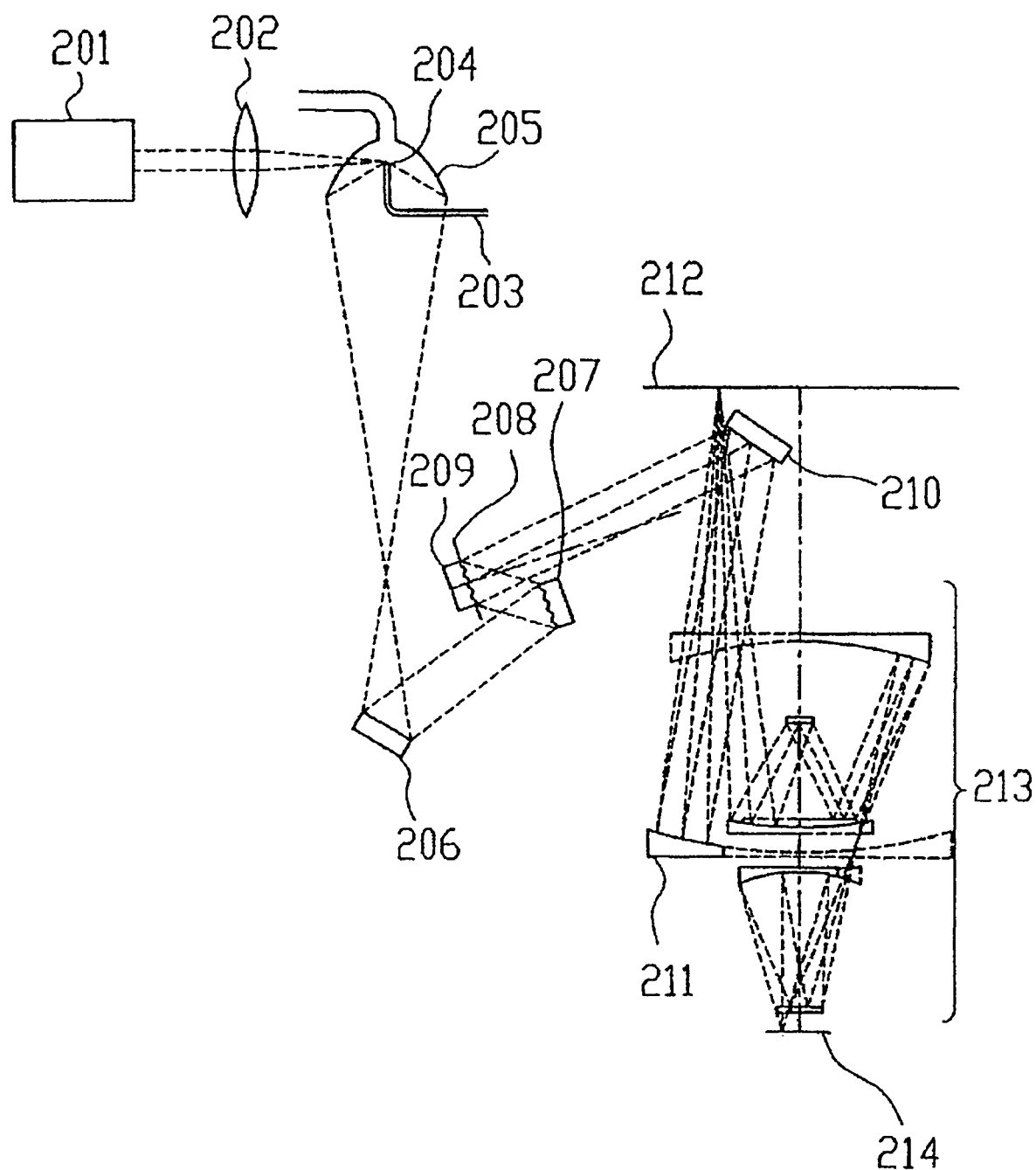
[FIG. 6] A view showing a schematic structure of a conventional projection exposure apparatus.

In the exposure apparatus in accordance with the above-mentioned embodiment, a liquid crystal display device as a microdevice can also be obtained by forming a predetermined pattern (circuit pattern, electrode pattern, or the like) on a plate (glass substrate). In the following, an example of techniques in this case will be explained with reference to the flowchart of FIG. 5. In FIG. 5, a pattern forming step S401 performs a so-called photolithography process in which a pattern of a mask is transferred and exposed to a photosensitive substrate (a glass substrate or the like coated with a resist). This photolithography process forms a predetermined pattern including a number of electrodes and the like on the photosensitive substrate. Thereafter, the exposed substrate is subjected to steps such as developing, etching, and resist-peeling processes, so that a predetermined pattern is formed on the substrate, whereby the flow shifts to a color filter forming step S402 subsequent thereto.

Next, the color filter forming step S402 forms a color filter in which a number of groups each composed of three dots corresponding to R (Red), G (Green), and B (Blue) are arranged in a matrix or a plurality of groups each composed of three stripe filters of R, G, and B are arranged in the direction of horizontal scanning lines. After the color filter forming step S402, a cell assembling step S403 is executed. The cell assembling step S403 assembles a liquid crystal panel (liquid crystal cell) by using the substrate having the predetermined pattern obtained at the pattern forming step S401, the color filter obtained at the color filter forming step S402, and the like. The cell assembling step S403 manufactures the liquid crystal panel (liquid crystal cell) by injecting a liquid crystal between the substrate having the predetermined pattern obtained at the pattern forming step S401 and the color filter obtained at the color filter forming step S402.

Thereafter, a module assembling step S404 attaches components such as an electric circuit for causing the assembled liquid crystal panel (liquid crystal cell) to perform a display action and a backlight to the liquid crystal panel, so as to complete the device as a liquid crystal display device. The above-mentioned method of manufacturing a liquid crystal display device performs exposure by using the exposure apparatus in accordance with the above-mentioned embodiment, and thus can prevent the resolving power, contrast, and the like from decreasing on the photosensitive substrate, whereby semiconductor devices having fine patterns can be obtained with a high throughput.

INDUSTRIAL APPLICABILITY

As in the foregoing, the illumination apparatus, exposure apparatus, and method of manufacturing a microdevice in accordance with the present invention are suitable for manufacturing microdevices such as high-performance semiconductor devices, liquid crystal display devices, and thin-film magnetic heads.

The invention claimed is:

1. An illumination apparatus for illuminating a surface to be irradiated with illumination light emitted from a light source, the illumination apparatus comprising:
   a reflection type fly-eye optical system, between the light source and the surface to be irradiated, the fly-eye optical system having a plurality of reflection partial optical systems for wavefront-dividing a light beam from the light source and superposing divided portions of the light beam onto each other on the surface to be irradiated; and
   a reflection type optical system, between the light source and the reflection type fly-eye optical system, for guiding the illumination light to the reflection type fly-eye optical system,
   wherein the reflection type optical system has a reflecting surface, at least partly constructed by a diffusing surface, the diffusing surface guiding an incident light beam to the reflection type fly-eye optical system, and
   wherein a diffusion angle of the diffusing surface is such an angle that a full width at half maximum of a range in which a light beam diffused from a point on the diffusing surface by the diffusing surface reaches an entrance surface of the reflection type fly-eye optical system is D/2 to D/100, where D is the entrance diameter of the fly-eye optical system.

2. An illumination apparatus according to claim 1, wherein a half width of a light beam spread from a point of the diffusing surface, at an entrance surface of the reflection type fly-eye optical system is D/2 to D/100, wherein D is the entrance diameter of the fly-eye optical system.

3. An illumination apparatus according to claim 1, wherein an RMS value indicating a surface roughness of the diffusing surface corresponding to a high-frequency region of a PSD (Power Spectral Density) value of a profile of the diffusing surface is smaller than 1/14 of a wavelength of the illumination light.

4. An illumination apparatus according to claim 3, wherein a boundary value between the high-frequency region and a frequency region lower than the high-frequency region is smaller than $D/2\lambda L$, where D is the diameter of an entrance surface of the reflection type fly-eye optical system, L is a distance from the reflection type optical system to the entrance surface of the reflection type fly-eye optical system, and $\lambda$ is a wavelength of the illumination light.

5. An illumination apparatus according to claim 3, wherein a boundary value between the high-frequency region and an intermediate frequency region is greater than $D/100\lambda L$, where D is the diameter of an entrance surface of the reflection type fly-eye optical system, L is a distance from the reflection type optical system to the entrance surface of the reflection type fly-eye optical system, and $\lambda$ is a wavelength of the illumination light.

6. An illumination apparatus according to claim 1, wherein the difference between a PSD (Power Spectral Density) value of a profile of the diffusing surface and a PSD value of a fractal curve, which represents the PSD value of an ideally polished surface profile, is smaller in a high-frequency region than in a frequency region lower than the high-frequency region.

7. An illumination apparatus according to claim 6, wherein a boundary value between the high-frequency region and a frequency region lower than the high-frequency region is smaller than $D/2\lambda L$, where D is the diameter of an entrance surface of the reflection type fly-eye optical system, L is a distance from the reflection type optical system to the entrance surface of the reflection type fly-eye optical system, and $\lambda$ is a wavelength of the illumination light.

8. An illumination apparatus according to claim 6, wherein a boundary value between the high-frequency region and an intermediate frequency region is greater than $D/100\lambda L$, where D is the diameter of an entrance surface of the reflection type fly-eye optical system, L is a distance from the reflection type optical system to the entrance surface of the reflection type fly-eye optical system, and $\lambda$ is a wavelength of the illumination light.

9. An illumination apparatus according to claim 1, wherein a surface roughness of the diffusing surface in a pitch finer than 1 mm is 0.5 to 3 nm RMS.

10. An illumination apparatus according to claim 1, wherein the light beam illuminating the surface to be irradiated is EUV light having a wavelength of 5 to 40 nm.

11. An exposure apparatus for transferring a pattern of a mask onto a photosensitive substrate;

the exposure apparatus comprising the illumination apparatus according to claim 1 for illuminating the mask.

12. An illumination apparatus according to claim 1, wherein the half width of a light beam, from the diffusing surface, at an entrance of the reflection type fly-eye optical system is D/2 to D/100, wherein D is the entrance diameter of the fly-eye optical system.

13. An illumination method for illuminating a surface to be irradiated with illumination light emitted from a light source, the illumination method comprising:
- wavefront-dividing a light beam from the light source and superposing divided portions of the light beam onto each other on the surface to be irradiated by a reflection type fly-eye optical system, between the light source and the surface to be irradiated, the fly-eye optical system having a plurality of reflection partial optical systems; and
- guiding the illumination light to the reflection type fly-eye optical system by a reflection type optical system, between the light source and the reflection type fly-eye optical system;
- wherein the reflection type optical system has a reflecting surface, at least partly constructed by a diffusing surface, the diffusing surface guiding an incident light beam to the reflection type fly-eye optical system, and
- wherein a diffusion angle of the diffusing surface is such an angle that a full width at half maximum of a range in which a light beam diffused from a point on the diffusing surface by the diffusing surface reaches an entrance surface of the reflection type fly-eye optical system is D/2 to D/100, where D is the entrance diameter of the fly-eye optical system.

14. An exposure method for exposing a pattern of a mask onto a photosensitive substrate, the exposure method comprising:
- illuminating a pattern of a mask to be irradiated with illumination light emitted from a light source using the illumination method of claim 13.

15. A method of manufacturing a microdevice, the method comprising:
- exposing a pattern of a mask onto a photosensitive substrate using the exposure method of claim 14; and
- developing the exposed photosensitive substrate.

16. An illumination method according to claim 13, wherein the half width of a light beam, from the diffusing surface, at an entrance of the reflection type fly-eye optical system is D/2 to D/100, wherein D is the entrance diameter of the fly-eye optical system.

* * * * *